US010739885B2

(12) United States Patent
Dong et al.

(10) Patent No.: US 10,739,885 B2
(45) Date of Patent: Aug. 11, 2020

(54) FLEXIBLE TOUCH PANEL AND DISPLAY APPARATUS

(71) Applicant: BOE TECHNOLOGY GROUP CO., LTD., Beijing (CN)

(72) Inventors: Tian Dong, Beijing (CN); Shiming Shi, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/745,054

(22) PCT Filed: Aug. 4, 2017

(86) PCT No.: PCT/CN2017/096013
§ 371 (c)(1),
(2) Date: Jan. 15, 2018

(87) PCT Pub. No.: WO2018/133383
PCT Pub. Date: Jul. 26, 2018

(65) Prior Publication Data
US 2019/0377443 A1 Dec. 12, 2019

(30) Foreign Application Priority Data
Jan. 20, 2017 (CN) .......................... 2017 1 0051816

(51) Int. Cl.
G06F 3/041 (2006.01)
H05K 1/02 (2006.01)
H05K 1/11 (2006.01)

(52) U.S. Cl.
CPC ........... G06F 3/0412 (2013.01); H05K 1/028 (2013.01); H05K 1/118 (2013.01); G06F 2203/04102 (2013.01)

(58) Field of Classification Search
CPC ........ G06F 3/0412; G06F 2203/04102; H05K 1/028; H05K 1/118
USPC ........................................................ 345/173
See application file for complete search history.

(56) References Cited

U.S. PATENT DOCUMENTS

| 2003/0137498 | A1* | 7/2003 | Huang ..................... G06F 3/044 345/173 |
| 2014/0139447 | A1* | 5/2014 | Kang ...................... G06F 3/044 345/173 |
| 2016/0188098 | A1 | 6/2016 | Her et al. |
| 2016/0282993 | A1* | 9/2016 | Song ....................... G06F 3/044 |

OTHER PUBLICATIONS

International Search Report and Written Opinion dated Nov. 10, 2017 in PCT/CN2017/096013.
1st Office Action dated Aug. 5, 2019 in CN201710051816.0.

* cited by examiner

Primary Examiner — Chanh D Nguyen
Assistant Examiner — Ngan T. Pham-Lu
(74) Attorney, Agent, or Firm — Syncoda LLC; Feng Ma

(57) ABSTRACT

The present disclosure provides a flexible touch panel and a display device. The flexible touch panel includes a flexible substrate baseplate and a flexible touch electrode pattern disposed on the flexible substrate baseplate, and a bendable area arranged on the flexible touch panel where the bendable area has at least one relatively fixed position, and at least part of the flexible touch electrode pattern is in the bendable area and has a cutoff region.

16 Claims, 7 Drawing Sheets

FLEXIBLE TOUCH PANEL AND DISPLAY APPARATUS

CROSS-REFERENCE TO RELATED APPLICATIONS

This patent application claims the priority of the Chinese Patent Application No. 201710051816.0 filed on Jan. 20, 2017, the entire contents of which are hereby incorporated by reference herein in its entirety.

TECHNICAL FIELD

The present disclosure relates to the technical field of display, and particularly to a flexible touch panel and a display apparatus.

BACKGROUND

As flexible display technology develops, there are increasing demands for flexible touch panels. In consideration of optical performance, a touch electrode pattern of the touch panel is generally made of a transparent electrically conductive metallic material such as indium tin oxide (ITO). When the touch electrode pattern is applied to a foldable type flexible touch panel, the touch panel may be bent again and again at fixed positions within the flexible touch panel when using it.

SUMMARY

The present disclosure provides a flexible touch panel and a display apparatus that may be bent.

The present disclosure provides a flexible touch panel. The flexible touch panel may include: a flexible substrate baseplate, and a touch electrode layer having a plurality of touch electrode patterns on the flexible substrate baseplate; where: the flexible touch panel has at least one bendable area, and at least one of the touch electrode patterns within the bendable area has a cutoff region to divide one electrode pattern into insulated portions.

In a possible implementation, each touch electrode pattern within the bendable area has the cutoff region to divide the electrode pattern into two substantially complementary portions.

In a possible implementation, each of the touch electrode patterns within the bendable area has the cutoff region to divide the one electrode pattern into the insulated portions.

In a possible implementation, connections of all cutoff regions within the bendable area bendable are substantially a straight line bendable area.

In a possible implementation, connections of all cutoff regions within the bendable area are substantially a bent line bendable area.

In a possible implementation, each touch electrode pattern within the bendable area has the cutoff region with central hollowed portions.

In a possible implementation, each touch electrode pattern within the bendable area comprises an outer contour.

In a possible implementation, a pattern line width of the outer contour of the touch electrode patterns within the bendable area is greater than 20 μm.

In a possible implementation, the flexible touch panel has one bendable area, the flexible touch panel is bendable along a first direction, and an extension direction of the bendable area is along a second direction that is substantially perpendicular to the first direction.

In a possible implementation, the cutoff region substantially extends along the extension direction of the bendable area.

In a possible implementation, all the touch electrode patterns within the bendable area have the cutoff region to divide one electrode pattern into two insulated portions, and the two insulated portions are distributed symmetrically in respect to the cutoff region.

In a possible implementation, the flexible touch panel further includes a plurality of jumper line with each electrically connecting adjacent touch electrode patterns.

In a possible implementation, the bendable are have at least one jumper line, and at least part of the at least one jumper line within the bendable area in the cutoff region of the bendable area.

In a possible implementation, each of more than one jumper lines is a straight line having a cutoff part in the cutoff region.

In a possible implementation, each of the more than one jumper lines is a bent line having a cutoff part in the cutoff region.

In a possible implementation, touch electrode patterns located on two sides of the cutoff region are connected by separated signal wirings and a single touch chip.

In a possible implementation, touch electrode patterns located on two sides of the cutoff region are connected by separated signal wirings and different touch chips.

In a possible implementation, one part of the touch electrode patterns comprises touch driving electrodes and another part of the touch electrode patterns comprises touch sense electrodes.

In another aspect, the present disclosure further provides a display apparatus.

It is to be understood that both the forgoing general description and the following detailed description are exemplary only, and are not restrictive of the present disclosure

BRIEF DESCRIPTION OF THE DRAWINGS

In order to more clearly illustrate the technical solutions in the embodiments of the present disclosure, drawings needing to be used in descriptions of the embodiments will be simply introduced. The drawings described below are only some embodiments of the present disclosure. Without creative work, a person of ordinary skill in the art may also obtain other drawings according to these drawings.

Figure 1:
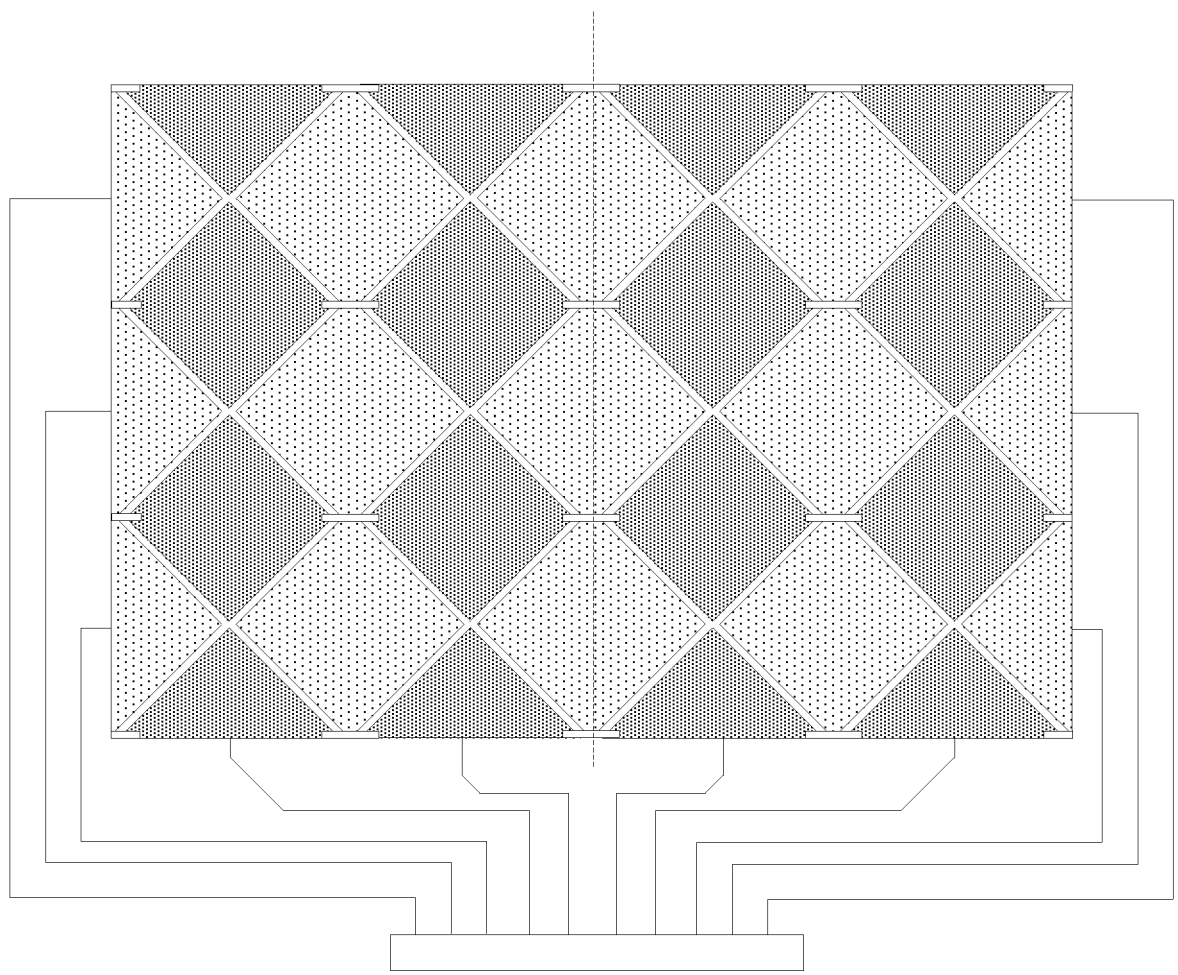
FIG. 1 illustrates a structural schematic view of a flexible touch panel.

Skilled artisans will appreciate that elements in the figures are illustrated for simplicity and clarity and have not necessarily been drawn to scale. For example, the dimensions and/or relative positioning of some of the elements in the figures may be exaggerated relative to other elements to help to improve understanding of various examples of the present disclosure. Also, common but well-understood elements that are useful or necessary in a commercially feasible example are often not depicted in order to facilitate a less obstructed view of these various examples. It will further be appreciated that certain actions and/or steps may be described or depicted in a particular order of occurrence while those skilled in the art will understand that such specificity with respect to sequence is not actually required. It will also be understood that the terms and expressions used herein have the ordinary technical meaning as is accorded to such terms and expressions by persons skilled in the technical field as set forth above, except where different specific meanings have otherwise been set forth herein.

DETAILED DESCRIPTION

The terminology used in the present disclosure is for the purpose of describing exemplary examples only and is not intended to limit the present disclosure. As used in the present disclosure and the appended claims, the singular forms "a," "an" and "the" are intended to include the plural forms as well, unless the context clearly indicates otherwise. It shall also be understood that the terms "or" and "and/or" used herein are intended to signify and include any or all possible combinations of one or more of the associated listed items, unless the context clearly indicates otherwise.

It shall be understood that, although the terms "first," "second," "third," etc. may be used herein to describe various information, the information should not be limited by these terms. These terms are only used to distinguish one category of information from another. For example, without departing from the scope of the present disclosure, first information may be termed as second information; and similarly, second information may also be termed as first information. As used herein, the term "if" may be understood to mean "when" or "upon" or "in response to" depending on the context.

Reference throughout this specification to "one embodiment," "an embodiment," "exemplary embodiment," or the like in the singular or plural means that one or more particular features, structures, or characteristics described in connection with an example is included in at least one embodiment of the present disclosure. Thus, the appearances of the phrases "in one embodiment" or "in an embodiment," "in an exemplary embodiment," or the like in the singular or plural in various places throughout this specification are not necessarily all referring to the same embodiment. Furthermore, the particular features, structures, or characteristics in one or more embodiments may be combined in any suitable manner.

Sometimes, due to poor flexibility of indium tin oxide (ITO) as shown in FIG. 1, the touch electrode pattern is prone to rupture nearby a bending line as shown by the dotted line in FIG. 1. When that happens, the flexible touch panel is destroyed.

Therefore, it is a technical problem to be solved to prevent the rupture of the touch electrode pattern from affecting the touch operation performance during use of the foldable type flexible touch panel.

Example implementations of the flexible touch panel and a display device according to embodiments of the present disclosure are described below in detail with reference to figures.

Shapes and sizes of components in the figures do not reflect real scale of the flexible touch panel and are only intended to illustrate the content of the present disclosure.

As shown in FIG. 2 through FIG. 7, a flexible touch panel according to some embodiments of the present disclosure may include: a flexible substrate baseplate 100, a touch electrode layer having a plurality of touch electrode patterns on the flexible substrate baseplate, and the flexible touch electrode pattern 200 disposed on the flexible substrate baseplate 100, and the flexible touch panel has at least one bendable area, and at least one of the touch electrode patterns within the bendable area 300 has a cutoff region to divide one electrode pattern into insulated portions.

The bendable area 300 arranged on the flexible touch panel and having at least one relatively fixed position, where at least part of the flexible touch electrode pattern 200 in the bendable area 300 has a cutoff region A that may divide the electrode pattern into two substantially complementary portions. Each of the touch electrode patterns within the bendable area has the cutoff region to divide the one electrode pattern into the insulated portions.

The bendable area 200 in the touch panel may be bended when needed. When the bendable area 200 is bended, the touch panel may be folded into two or multiple folds from a flat touch panel. Not all areas of the touch panel may be bent. When the touch panel is folded, the bendable area 200 may be bent and the rest of areas of the touch panel may not be bent, and may be the relatively fixed positions. The purpose of the bendable area 200 is for the touch panel to be folded. Sometimes, the bendable area 300 may have a cutoff region that may have a substantially 90% difference from the direction of the folding of the touch panel. For example, in FIG. 6, each bendable area 300 has a cutoff region that has a horizontal direction while the touch panel may be folded vertically. Thus, the flexible touch panel may have one bendable area, the flexible touch panel may be bendable along a first direction, and an extension direction of the bendable area may be along a second direction that is substantially perpendicular to the first direction. The cutoff region may substantially extend along the extension direction of the bendable area. As such, all the touch electrode patterns within the bendable area may have the cutoff region to divide one electrode pattern into two insulated portions, and the two insulated portions may be distributed symmetrically in respect to the cutoff region.

Figure 3:
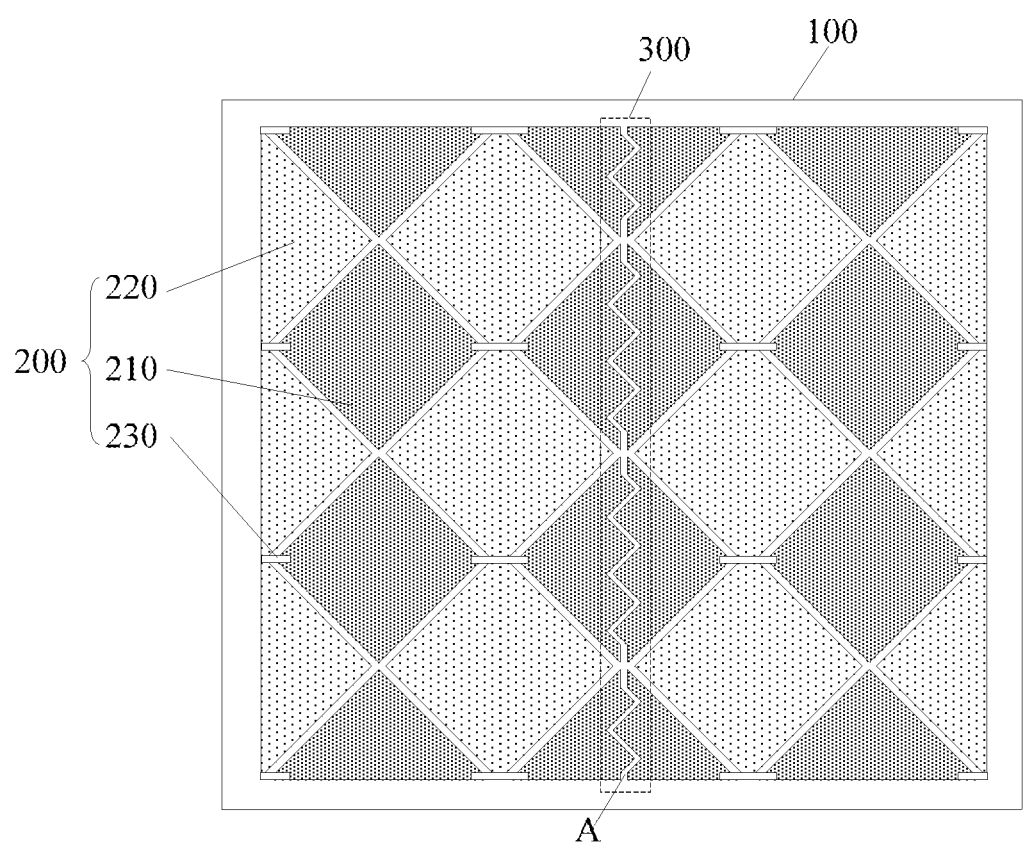
FIG. 3 illustrates a second structural schematic view of a flexible display panel according to some embodiments of the present disclosure.
Figure 4:
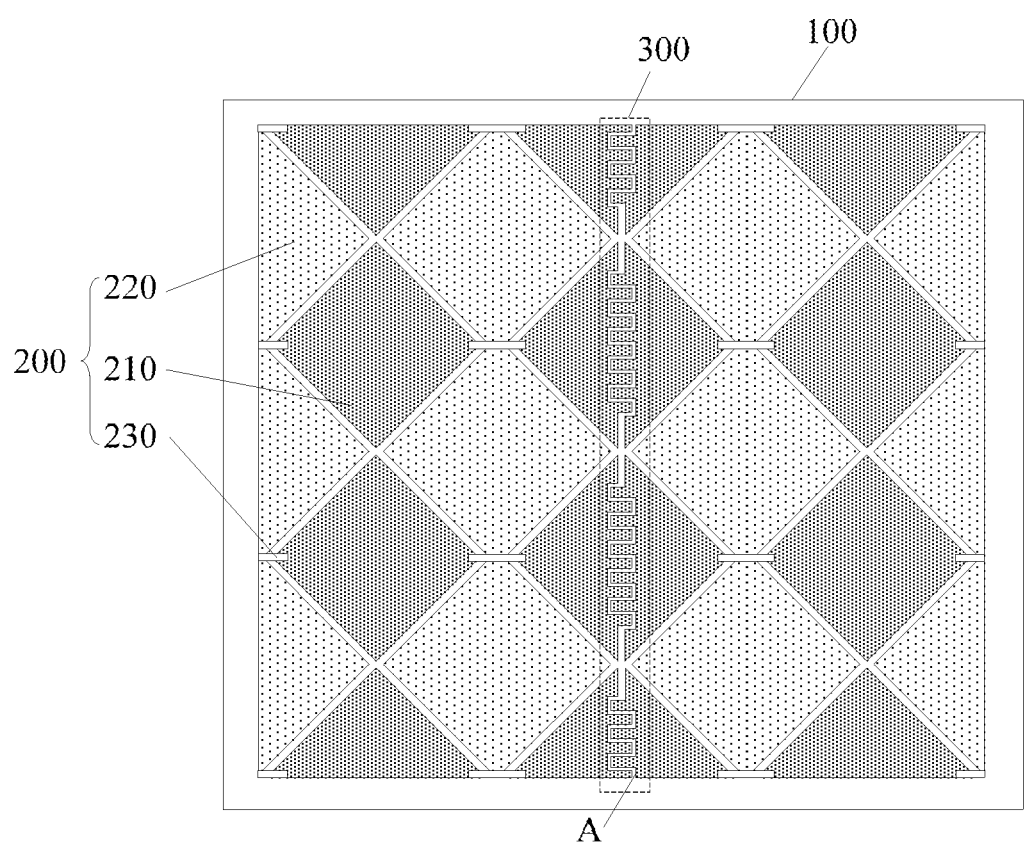
FIG. 4 illustrates a third structural schematic view of a flexible display panel according to some embodiments of the present disclosure.

However, as shown in FIGS. 3 and 4, sometimes, even though the direction of the folding is substantially vertical, the bendable area 300 may have the cutoff regions with more than one directions. Such directions may or may not be the same.

Thus, connections of all cutoff regions within the bendable area bendable may be substantially a straight line bendable area. Sometimes, connections of all cutoff regions within the bendable area are substantially a bent line bendable area as shown in FIGS. 3 and 4.

In the flexible touch panel, the flexible touch electrode pattern 200 may be liable for the rupture in the bendable area 300 which is at a relatively fixed position. A transparent electrically conductive material with poor flexibility such as ITO may be selected, for optical performance, as the material for making the flexible touch electrode pattern 200. Therefore, in the bendable area 300 which is liable to rupture, at least part of the flexible touch electrode pattern 200 is directly arranged with the cutoff region A.

However, when at least part of the flexible touch electrode pattern 200 disposed in the bendable area 300 is removed, the location at the cutoff region A may be enabled to release stress when it is bent. Thus, damages caused by the stress generated by the bending to the flexible touch electrode pattern 200 may be avoided in the bendable area 300, and at the same time, the removal of the part of flexible touch electrode pattern in the bendable area does not affect the touch operation performance.

It should be noted that the flexible touch panel according to the embodiment of the present disclosure may be adapted for a flexible display panel having a relatively fixed folding position. Generally, the bendable area 300 is located in the middle of the flexible touch panel, for example, on a central axis. Sometimes, the bendable area 300 may be disposed closely at an edge position of the flexible touch panel in accordance with the requirement of some applications. Also, the number of the bendable areas 300 may be one or more.

The following examples describe the scenarios that the bendable area 300 is disposed in the middle of the flexible touch panel. However, in practice, the bendable area 300 may be in the other areas of the flexible touch panel.

In the flexible touch panel according to the embodiment of the disclosure, at least part of the flexible touch electrode pattern 200 in the bendable area 300 is arranged to contain a cutoff region A. The flexible touch electrode patterns 200 on two sides of the cutoff region A may be independent from each other and may be spaced apart by the cutoff region A.

To ensure normal performance of touch detection, it is possible to respectively arrange a separated signal wiring connected with a touch chip at the flexible touch electrode patterns 200 on two sides of the cutoff region A. The flexible touch electrode patterns 200 on each side of the cutoff region A is connected with the touch chip via a corresponding signal wiring respectively.

When the flexible touch electrode pattern 200 is completely cut off at the bendable area 300 as shown in FIG. 2 through FIG. 5, the flexible touch electrode pattern 200 is divided into two completely independent pattern regions along the location of the cutoff region A. A left pattern and a right pattern as shown in the figures.

Thus, it is possible to respectively use an independent touch chip to control the left pattern and right pattern to execute the touch detection function. The flexible touch panel may be considered as two independent panels. The flexible touch electrode patterns 200 located on two sides of the cutoff region A may be respectively connected with different touch chips through respective signal wirings. Thus, touch electrode patterns located on two sides of the cutoff region may be connected by separated signal wirings and a single touch chip. Also, touch electrode patterns located on two sides of the cutoff region are connected by separated signal wirings and different touch chips.

In a possible implementation, one part of the touch electrode patterns may include touch driving electrodes and another part of the touch electrode patterns may include touch sense electrodes.

In the flexible touch panel according to the embodiment of the disclosure, to make the location of the cutoff region A of the flexible touch electrode pattern 200 in the bendable area 300 invisible as much as possible and to mitigate the impact on display consistency of the flexible touch panel, in one implementation, the location of the cutoff region A of the flexible touch electrode pattern 200 may be as small as possible. Thus, a gap of the cutoff region A should be as narrow as possible, and the pattern at the location of the cutoff region A may be designed as disorderly as possible to make the location not easily be noticed.

In one implementation, in the flexible touch panel according to the embodiment of the disclosure, the flexible touch electrode pattern 200, as shown in FIG. 2 through FIG. 7, generally may include: touch driving electrodes 210 and touch induction electrodes 220. An extension direction of the touch driving electrodes 210 may be a horizontal direction as shown in FIG. 2 through FIG. 7. Correspondingly, an extension direction of the touch induction electrodes 220 may be a vertical direction. Alternatively, the extension direction of the touch driving electrodes 210 may be a vertical direction, and correspondingly, the extension direction of the touch induction electrodes 220 may be a horizontal direction. The extension directions may have many variations. The touch driving electrodes 210 and touch induction electrodes 220 may be generally shaped as a diamond.

In some embodiments, the touch driving electrodes 210 and touch induction electrodes 220 may be shaped as square or circle. In some embodiments, the touch driving electrodes 210 and touch induction electrodes 220 are shaped as the same. In some embodiments, shapes of the touch driving electrodes 210 and touch induction electrodes 220 are different from each other.

The flexible touch electrode pattern 200, as shown in FIG. 2 through FIG. 7, generally may include: a jumper line 230 that bridges adjacent touch driving electrodes 210 or adjacent touch induction electrodes 220. The bendable area may have at least one jumper line, and at least part of the at least one jumper line within the bendable area may be in the cutoff region of the bendable area In FIG. 2 through FIG. 7, the example is provided to show the jumper line 230 to bridge adjacent touch driving electrodes 210. The jumper line may also bridge adjacent touch induction electrodes which is not shown in FIG. 2 through FIG. 7. Thus, a plurality of jumper line with each electrically connecting adjacent touch electrode patterns.

In the flexible touch panel according to the embodiment of the disclosure, the touch driving electrodes 210 and touch induction electrodes 220 included by the flexible touch electrode pattern 200 generally may use a transparent electrically conductive material such as ITO. The jumper line 230 may use either a metallic material or a transparent electrically conductive material. The present disclosure does not limit the use of materials.

Based on the above flexible touch electrode pattern 200, in the flexible touch panel according to the embodiment of the disclosure, there may be the cutoff region A with different patterns depending on different structures of the flexible touch electrode pattern 200 included in the bendable area 300. Detailed depictions are provided by describing several examples below.

Figure 2:
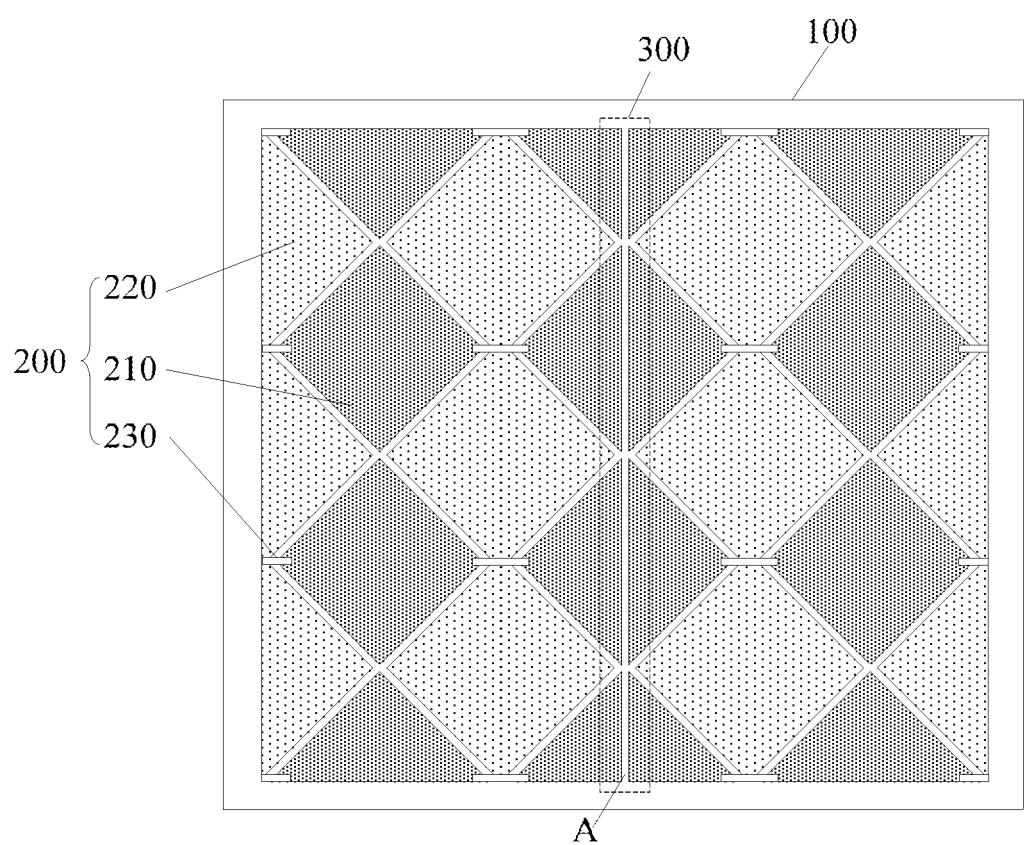
FIG. 2 illustrates a first structural schematic view of a flexible display panel according to some embodiments of the present disclosure.

In the flexible touch panel according to the present embodiment, as shown in FIG. 2 through FIG. 4, the touch driving electrodes 210 or touch induction electrodes 220 included in the bendable area 300 have the cutoff region A in the extension direction of the bendable area 300.

In one implementation, the electrodes located in the cutoff region A need to be determined according to whether the flexible touch electrode pattern 200 included at the location of the bendable area 300 is in the touch driving electrodes 210 or touch induction electrodes 220. Each of FIG. 2 through FIG. 4 exemplarily illustrates the bendable area 300 covering the touch driving electrodes 210 as an example. In the extension direction of the bendable area 300, multiple touch driving electrodes 210 in the bendable area 300 contain the cutoff region A.

Specific graphs for performing the cutoff processing may employ multiple manners. For example, performing the cutoff processing may be in a straight line manner as shown in FIG. 2, performing the cutoff processing may be in a bent line manner as shown in FIG. 3 and FIG. 4, or performing the cutoff processing may be in a curved line manner. Performing the cutoff processing may also be in other ways which are not elaborated herein. In another implementation, the cutoff graph resulting from the cutoff processing in the bent line manner may be more disorderly than that resulting from the cutoff processing in the straight line manner and may not be easily noticed. However, the graphs other than the straight line may be more complicated, and may impose certain requirements for the precision of the manufacturing process.

As shown in FIG. 2, the touch driving electrodes 210 or touch induction electrodes 220 included in the bendable area 300 have a straight line cutoff region A in the extension direction of the bendable area 300. As shown in FIG. 3 and FIG. 4, the touch driving electrodes 210 or touch induction electrodes 220 included in the bendable area 300 have a bent line cutoff region A in the extension direction of the bendable area 300. When the cutoff processing is performed in the bent line manner, the touch driving electrodes 210 or touch induction electrodes 220 included in the bendable area 300 may have a serrated bent line cutoff region A as shown in FIG. 3 or a concave and convex bent line cutoff region A as shown in FIG. 4 in the extension direction of the bendable area 300.

In the flexible touch panel according to the present embodiment, when the touch driving electrodes 210 or touch induction electrodes 220 in the bendable area 300 are cut off, it may further perform a hollowing processing at the cutoff location to further release the stress during the bending.

Figure 5:
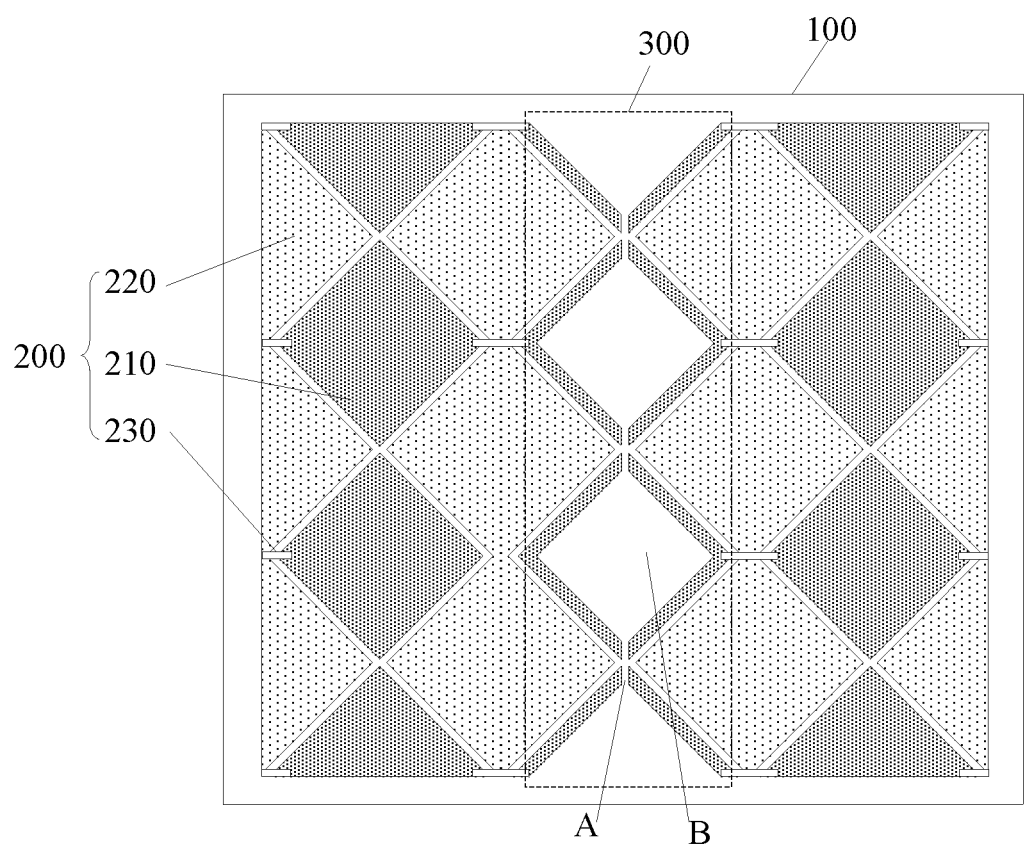
FIG. 5 illustrates a fourth structural schematic view of a flexible display panel according to some embodiments of the present disclosure.

As shown in FIG. 5, the touch driving electrodes 210 or touch induction electrodes 220 having the straight line cutoff region A further have a central hollowed region B including the cutoff region A. A central region of the touch driving electrodes 210 or touch induction electrodes 220 having the cutoff region A is hollowed on the basis of the cutoff region A. Thus, the touch electrode pattern within the bendable area may have the cutoff region with central hollowed portions.

Such hollowed region B and the cutoff region A in the hollowed region B may facilitate the folding of the touch panel. When the foldable area as shown in FIG. 5 is substantially hollowed, the touch panel may be folded along the cutoff region A without much resistance. Because the foldable area is hollowed, the touch panel may be folded repeatedly without wearing out the foldable area.

In one implementation, the shape of the hollow may vary. For example, it may be a shape such as circle, rectangle or polygon. However, a maximum hollowing degree should be a pattern line width that may be ensured by the capacity of the process. The hollowing should ensure integrity of outer contour of the touch driving electrodes 210 or touch induction electrodes 220. Each touch electrode pattern within the bendable area may have the cutoff region with central hollowed portions.

For example, as shown in FIG. 5, the central hollowed regions B of the touch driving electrodes 210 or touch induction electrodes 220 having the straight line cutoff region A are arranged to match the outer contour of the touch driving electrodes 210 or touch induction electrodes 220. The pattern line width of the touch driving electrodes 210 or touch induction electrodes 220 having the central hollowed regions B may be greater than 20 μm. Thus, the pattern line width of the outer contour of the touch electrode patterns within the bendable area may be greater than 20 μm.

In Example 1 and Example 2, by means of designing the location of the bendable area 300, it may ensure that the touch driving electrodes 210 or the touch induction electrodes 220 having the cutoff region A are distributed symmetrically in respect to the cutoff region A.

Figure 6:
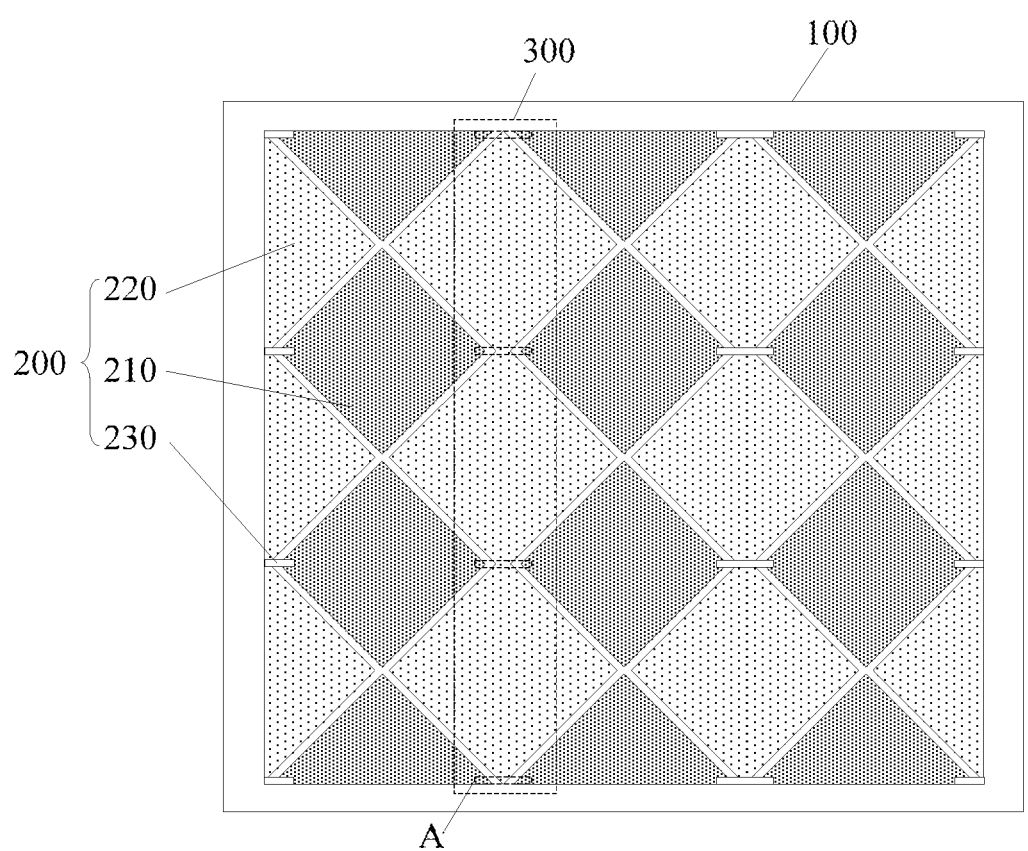
FIG. 6 illustrates a fifth structural schematic view of a flexible display panel according to some embodiments of the present disclosure.
Figure 7:
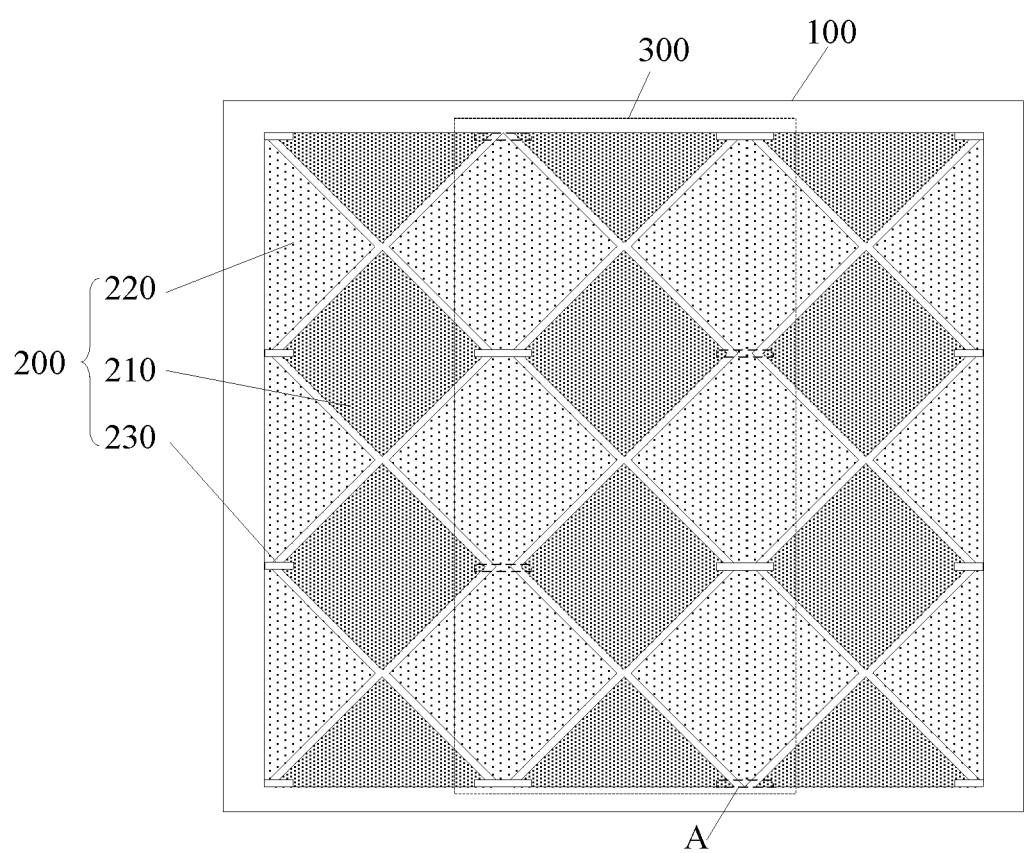
FIG. 7 illustrates a sixth structural schematic view of a flexible display panel according to some embodiments of the present disclosure.

In the flexible touch panel according to the present embodiment, as shown in FIG. 6 and FIG. 7, when the bendable area 300 includes the jumper line 230, at least part of the jumper line 230 included in the bendable area 300 may have the cutoff region A. As such, the impact exerted by the stress to the jumper line 230 may be reduced and the rupture of the jumper line 230 which may affect the touch operation performance can be prevented. Thus, each of more than one jumper lines may be a straight line having a cutoff part in the cutoff region. Sometimes, the more than one jumper lines may also be a bent line having a cutoff part in the cutoff region.

In one implementation, it is possible to perform the cutoff processing for all jumper lines 230, or a part of lines 230 included in the bendable area 300 or other variations which are not elaborated herein. For example, as shown in FIG. 6, each of jumper lines 230 that are located on the same straight line may be arranged to have the cutoff region A. Alternatively, as shown in FIG. 7, each of jumper lines 230 that extend in the bent line may be arranged to have the cutoff region A. In both FIG. 6 and FIG. 7, the cutoff region A is illustrated as jumper lines 230 that have dotted lines. The jumper lines 230 having dotted lines are to be moved. In practice, it is possible to remove merely part of jumper lines rather than the whole jumper lines in order to perform the cutoff processing.

It should be noted that in the flexible touch panel according to the embodiment of the present disclosure, the cutoff processing may be performed only for the touch driving electrodes 210 or for touch induction electrodes 220 included in the bendable area 300. Alternatively, the cutoff processing may be performed only for the jumper lines 230 included in the bendable area 300, or simultaneously for the touch driving (induction) electrodes 210 (220) and the jumper lines 230 included in the bendable area 300. Other variations may be available and the present disclosure does not elaborate.

Based on the same disclosed concept, embodiments of the present disclosure may further provide a display device. The display device may include the flexible touch panel described above according to embodiments of the present disclosure. The display device may be any product or component having the display function such as a mobile phone, a tablet computer, a TV set, a display, a notebook computer, a digital photo frame or a navigator. The implementation of the display device may refer to the above embodiments of the flexible touch panel. Thus, the present disclosure does not described repeatedly herein.

In the flexible touch panel and display device according to the embodiments of the disclosure, the flexible touch electrode pattern may be liable to rupture at the bendable area at a fixed position when a transparent electrically conductive material with an undesirable flexibility is selected as the material for making the flexible touch electrode pattern for optical performance. Therefore, in the bendable area which is liable to rupture, at least part of the flexible touch electrode pattern may be directly arranged as a cutoff region. Thus, at least part of the flexible touch electrode pattern which should have been disposed in the bendable area is removed, thereby enabling these cutoff locations to release stress when the bendable area is bent. Also, damages caused by the stress generated by the bending to the flexible touch electrode pattern in the bendable area may be avoided. Such arrangement may not affect the touch operation performance.

Obviously, those skilled in the art may make various modification and variations to embodiments of the present disclosure without departing from the spirit and scope of the present disclosure. As such, if these modifications and variations fall within the scope of claims of the present disclosure and equivalent technologies thereof, the present disclosure is intended to cover these modifications and variations.

What is claimed is:

1. A flexible touch panel, comprising:
   a flexible substrate baseplate, and
   a touch electrode layer comprising a plurality of touch electrode patterns on the flexible substrate baseplate;
   wherein:
   the flexible touch panel has at least one bendable area, and at least one of the touch electrode patterns within the bendable area has a cutoff region to divide one electrode pattern into insulated portions;
   the flexible touch panel further comprises a plurality of jum per lines with each electrically connecting adjacent touch electrode patterns;
   the bendable area has at least one jumper line, and at least part of the at least one jumper line within the bendable area is in the cutoff region of the bendable area; and
   each of the more than one jumper lines is a bent line having a cutoff part in the cutoff region.

2. The flexible touch panel according to claim 1, wherein each touch electrode pattern within the bendable area has the cutoff region to divide the electrode pattern into two substantially complementary portions.

3. The flexible touch panel according to claim 2, wherein each of the touch electrode patterns within the bendable area has the cutoff region to divide the one electrode pattern into the insulated portions.

4. The flexible touch panel according to claim 1, wherein connections of all cutoff regions within the bendable area are substantially a straight line bendable area.

5. The flexible touch panel according to claim 4, wherein connections of all cutoff regions within the bendable area are substantially a bent line bendable area.

6. The flexible touch panel according to claim 1, wherein each touch electrode pattern within the bendable area has the cutoff region with central hollowed portions.

7. The flexible touch panel according to claim 6, wherein each touch electrode pattern within the bendable area comprises an outer contour.

8. The flexible touch panel according to claim 7, wherein a pattern line width of the outer contour of the touch electrode patterns within the bendable area is greater than 20 µm.

9. The flexible touch panel according to claim 1, wherein the flexible touch panel has one bendable area, the flexible touch panel is bendable along a first direction, and an extension direction of the bendable area is along a second direction that is substantially perpendicular to the first direction.

10. The flexible touch panel according to claim 9, wherein the cutoff region substantially extends along the extension direction of the bendable area.

11. The flexible touch panel according to claim 10, wherein all the touch electrode patterns within the bendable area have the cutoff region to divide one electrode pattern into two insulated portions, and the two insulated portions are distributed symmetrically in respect to the cutoff region.

12. The flexible touch panel according to claim 1, wherein touch electrode patterns located on two sides of the cutoff region are connected by separated signal wirings and a single touch chip.

13. The flexible touch panel according to claim 1, wherein touch electrode patterns located on two sides of the cutoff region are connected by separated signal wirings and different touch chips.

14. The flexible touch panel according to claim 13, wherein one part of the touch electrode patterns comprises touch driving electrodes and another part of the touch electrode patterns comprises touch sense electrodes.

15. A display apparatus, comprising the flexible touch panel according to claim 1.

16. The display apparatus of claim 15, wherein each touch electrode pattern within the bendable area has the cutoff region to divide the electrode pattern into two substantially complementary portions.

* * * * *